United States Patent
Yang (10) Patent No.: US 10,692,939 B2
(45) Date of Patent: Jun. 23, 2020

(54) MULTI-VIEW DISPLAY DEVICE

(71) Applicant: LG DISPLAY CO., LTD., Seoul (KR)

(72) Inventor: Yu-Cheol Yang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/219,752

(22) Filed: Dec. 13, 2018

(65) Prior Publication Data

US 2019/0189705 A1  Jun. 20, 2019

(30) Foreign Application Priority Data

Dec. 18, 2017 (KR) .......................... 10-2017-0173899

(51) Int. Cl.
   *G09G 3/3225* (2016.01)
   *H01L 27/32* (2006.01)
   *H01L 51/52* (2006.01)
   *H01L 33/36* (2010.01)
   *H01L 51/56* (2006.01)

(52) U.S. Cl.
   CPC ....... *H01L 27/3218* (2013.01); *G09G 3/3225* (2013.01); *H01L 27/322* (2013.01); *H01L 27/3246* (2013.01); *H01L 33/36* (2013.01); *H01L 51/5218* (2013.01); *H01L 51/5221* (2013.01); *H01L 51/5256* (2013.01); *H01L 51/5284* (2013.01); *G09G 2320/028* (2013.01); *G09G 2354/00* (2013.01); *H01L 51/56* (2013.01); *H01L 2251/558* (2013.01)

(58) Field of Classification Search
   CPC ............... H01L 27/3218; H01L 27/322; H01L 27/3246; H01L 33/36; G09G 3/3225
   See application file for complete search history.

(56) References Cited

U.S. PATENT DOCUMENTS

| | | | |
|---|---|---|---|
| 2010/0085517 A1* | 4/2010 | Hong | H04N 13/00 349/106 |
| 2012/0200795 A1* | 8/2012 | Takatori | G02B 30/27 349/33 |
| 2013/0002974 A1* | 1/2013 | Minato | G02B 5/201 349/43 |
| 2015/0176775 A1* | 6/2015 | Gu | G02F 1/133617 349/42 |
| 2015/0340655 A1* | 11/2015 | Lee | H01L 27/322 257/40 |
| 2017/0192263 A1* | 7/2017 | Jiang | G02F 1/1323 |

\* cited by examiner

*Primary Examiner* — Sarah Lhymn
(74) *Attorney, Agent, or Firm* — Polsinelli PC (57) ABSTRACT

A multi-view display device, in which first to third red subpixels configured to display first-first to first-third view images are defined by dividing a red subpixel on which a first organic light emitting layer is deposited, first to third green subpixels configured to display second-first to second-third view images are defined by dividing a green subpixel on which a second organic light emitting layer is deposited, and first to third blue subpixels configured to display third-first to third-third view images are defined by dividing a blue subpixel on which a third organic light emitting layer is formed.

20 Claims, 7 Drawing Sheets

MULTI-VIEW DISPLAY DEVICE

CROSS-REFERENCE TO RELATED APPLICATION

The present application claims the priority from and the benefit of Korean Patent Application No. 10-2017-0173899 filed in Republic of Korea on Dec. 18, 2017, which is hereby incorporated by reference in its entirety for all purposes as if fully set forth herein.

BACKGROUND

Field of the Disclosure

The present disclosure relates to a display device, and more particularly, to a multi-view display device. Although the present disclosure is suitable for a wide scope of applications, it is particularly suitable for providing a multi-view display device that can display two or more images such that the images can be viewed in multiple directions with a high resolution.

Describing of the Background

Recently, with the advent of the information-oriented society, as interest in information displays for processing and displaying a massive amount of information and demand for portable information media have increased, a display field has rapidly advanced. Thus, various lightweight and thin flat panel display devices have been developed and highlighted.

As examples of the flat display devices, there are a liquid crystal display (LCD) device, a plasma display panel (PDP) device, a field emission display (FED) device, an electroluminescence display (ELD) device, an organic light emitting diode display (OLED) device, and the like. The flat display devices exhibit excellent characteristics such as thin and light profile and reduced power consumption, and thus have rapidly replaced the conventional cathode ray tube (CRT) displays.

Among the flat panel display devices, the OLED device is a self-luminescent type device and does not require a backlight unit used in the LCD device as a non-self-luminescent type device. As a result, the OLED device can be lightweight and thin.

In addition, the OLED device has advantages of a viewing angle, a contrast ratio, and power consumption as compared with the LCD device. Furthermore, the OLED device may be driven with a low direct current (DC) voltage and has a rapid response speed. Moreover, since interior components of the OLED device are in a solid state, the OLED device has high durability against the external impact and has a wide operation temperature range.

Particularly, since the OLED device is manufactured through a simple process, manufacturing costs can be saved more than the conventional LCD device.

The OLED device is a self-luminescent device that emits light through an LED, and the LED emits light through an organic electroluminescence phenomenon.

Figure 1:
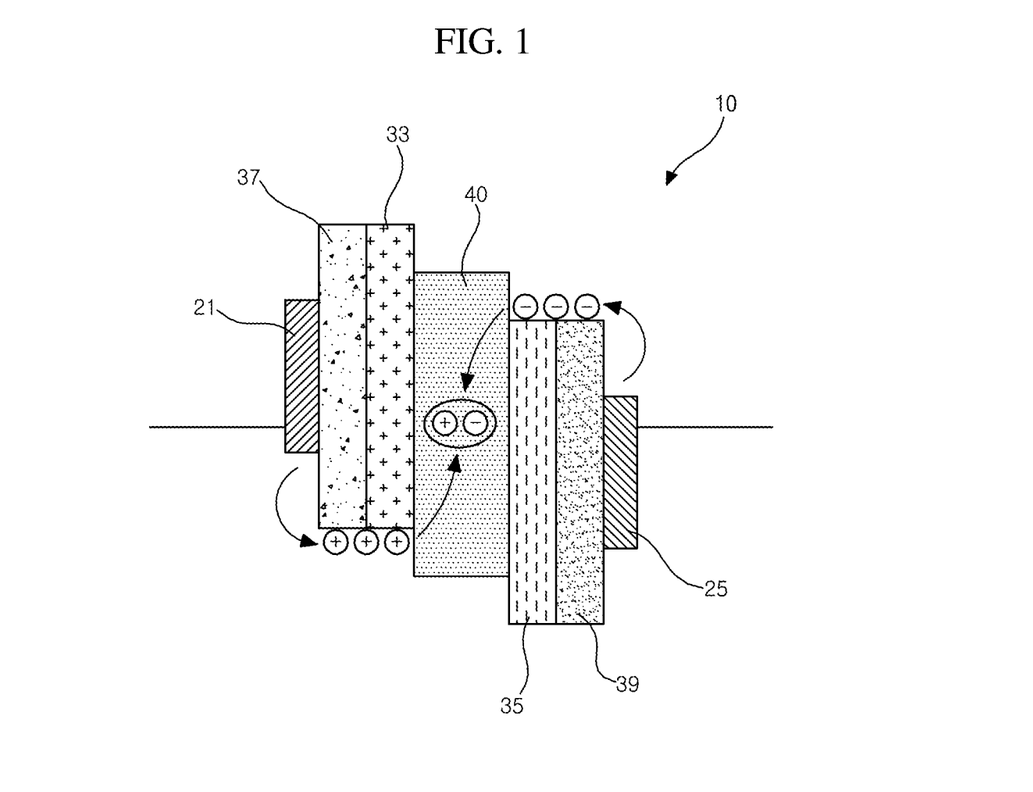
FIG. 1 is a band diagram of a light emitting diode (LED) having an emission principle based on an organic electroluminescence phenomenon.

FIG. 1 is a band diagram illustrating an LED having an emission principle based on an organic electroluminescence phenomenon.

As illustrated in FIG. 1, an LED 10 is formed of an anode 21, a cathode 25, and an organic light emitting layer disposed therebetween. The organic light emitting layer includes a hole transport layer (HTL) 33, an electron transport layer (ETL) 35, and an emitting material layer (EML) 40 interposed between the HTL 33 and the ETL 35.

To improve luminous efficiency, a hole injection layer (HIL) 37 is interposed between the anode 21 and the HTL 33, and an electron injection layer (EIL) 39 is interposed between the cathode 25 and the ETL 35.

In the LED 10, when a positive voltage and a negative voltage are applied to the anode 21 and the cathode 25, respectively, the holes of the anode 21 and the electrons of the cathode 25 are transported to the EML 40 and form excitons, and when such excitons are transitioned from the excited state to the ground state, light is generated and emitted in the form of visible light by the EML 40.

The OLED device including the LED 10 is designed as a two-dimensional display that can be simultaneously viewed by multiple users.

Such the display characteristic of the display allows a viewer to view the same high-quality image from different directions.

However, recently, it is required that different information from the same display be viewed by each user. For example, a driver in a vehicle may want to view navigation data while a passenger may want to watch a movie. In another example, each player in a computer game for two or more players may want to watch the game in his or her own view.

These conflicting requirements can be met by providing two separate displays, but such a way requires excessive space and increase the cost.

SUMMARY

Accordingly, the present disclosure is directed to a multi-view display device that substantially obviates one or more of the problems due to limitations and disadvantages of the related art.

In addition, the present disclosure is to provide a multi-view display device that can display two or more images such that the images are visible in different directions.

Further, the present disclosure is to provide a multi-view display device that can have a high resolution.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a multi-view display device includes: first to third red subpixels, first to third green subpixels, and first to third blue subpixels which are on an array substrate and constitute a single unit pixel; a red color filter corresponding to the first to third red subpixels, a green color filter corresponding to the first to third green subpixels, a blue color filter corresponding to the first to third blue subpixels, wherein the red, green and blue color filters are on a color filter encapsulation substrate facing the array substrate; and black matrices which are on the color filter encapsulation substrate, include first red, green, and blue openings respectively corresponding to the first red, green, and blue subpixels, and overlap with the second and third red, green, and blue subpixels, wherein the first to third red subpixels respectively display a first-first view image, a first-second view image, and a first-third view image, the first to third green subpixels respectively display a second-first view image, a second-second view image, and a second-third view image, and the first to third blue subpixels respectively display a third-first view image, a third-second view image, and a third-third view image, and wherein the first-first view image, the second-first view image, and the third-first view image realize a first view image, the first-second view image, the second-second view image, and the third-second view image realize a second view image, and the first-third view image, the second-third view image, and the third-third view image realize a third view image.

In another aspect of the present disclosure, a multi-view display device including first to third red subpixels, first to third green subpixels and first to third blue subpixels disposed on an array substrate and constituting a single unit pixel, and the first to third red subpixels respectively display a first-first view image, a first-second view image, and a first-third view image, the first to third green subpixels respectively display a second-first view image, a second-second view image, and a second-third view image, and the first to third blue subpixels respectively display a third-first view image, a third-second view image, and a third-third view image includes a black matrix disposed on the color filter encapsulation substrate, having first red, green, and blue openings respectively corresponding to the first red, green, and blue subpixels; a first electrode disposed at each of the first to third red, green, and blue subpixels; a bank separating the first electrode disposed at each of the first to third red, green, and blue subpixels; first, second and third organic light emitting layer respectively disposed on the first electrode of the first to third red subpixels, the first to third green subpixels and the first to third blue subpixels; and a second electrode of a semi-transmissive conductive material disposed on each of the first to third organic light emitting layers.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Reference will now be made in detail to exemplary aspects, examples of which are illustrated in the accompanying drawings. The same reference numbers may be used throughout the drawings to refer to the same or like parts.

Figure 2A:
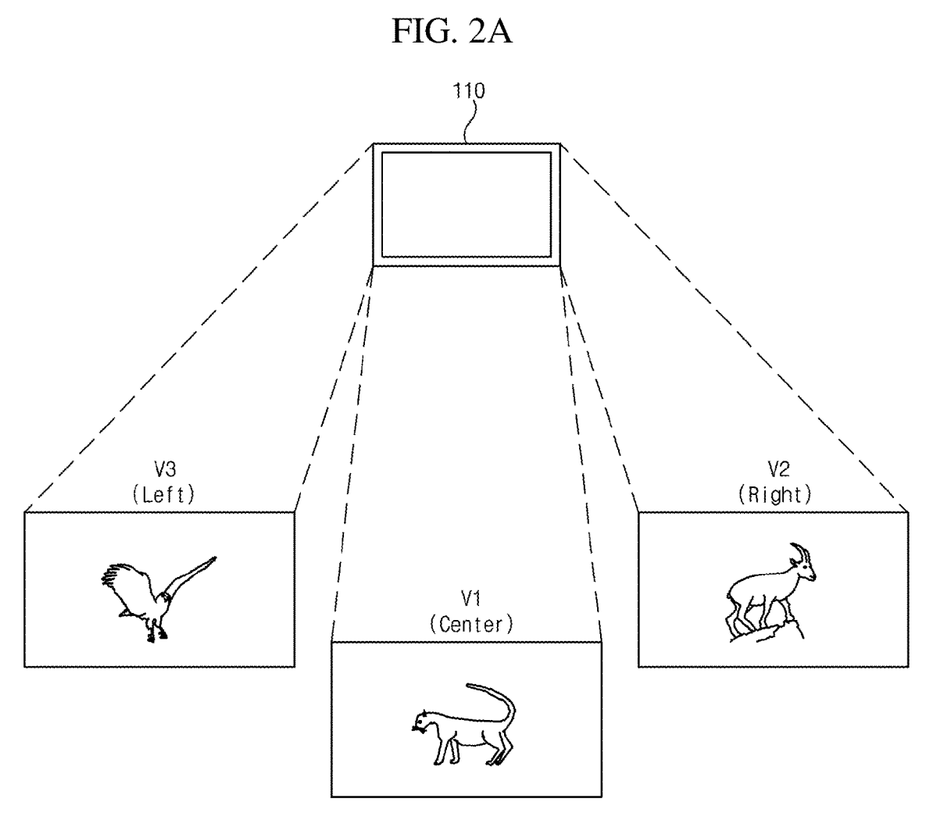
FIG. 2A is a conceptual view schematically illustrating a multi-view display device with which images are visible in three different directions according to an aspect of the present disclosure.
Figure 2B:
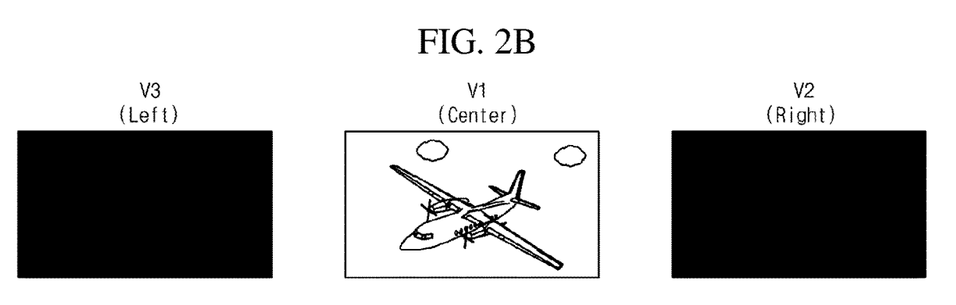
FIG. 2B is a schematic conceptual view for describing a privacy protection mode using a multi-view display device according to an aspect of the present disclosure.

FIG. 2A is a conceptual view schematically illustrating a multi-view display device with which images are visible in three different directions according to an aspect of the present disclosure, and FIG. 2B is a schematic conceptual view for describing a privacy protection mode using a multi-view display device according to an aspect of the present disclosure.

As illustrated in FIG. 2A, the multi-view display device displays two or three different images on a single display panel 110 by a method of controlling viewing angles.

In other words, different images V1, V2, and V3 are displayed on the center, right, and left portions. In FIG. 2A, a triple-view display device with which different images are visible when the display panel 110 is viewed from the center (V1), viewed from the left at an angle of 50° from the center (V3), and viewed from the right at an angle of 50° from the center (V2) is illustrated as an example.

The multi-view display device simultaneously provides multiple images V1, V2, and V3, which differ from each other according to viewing directions, using the single display panel 110. Light incident from the display panel 110 is divided into the center, left, and right using barriers so that three different images V1, V2, and V3 are simultaneously displayed.

Accordingly, the multi-view display device may be used to watch TV at the center and play game or surf the Internet at the left or right side.

The multi-view display device may also be applied as a vehicle navigation device and an advertisement display capable of multi-screen display. For example, in the case of a vehicle navigation device, while a navigation screen is provided to a driver and road information to a destination is displayed to the driver, a screen that allows tour information to be searched for may be displayed to a passenger of a front passenger seat, and a passenger of a back passenger seat may be allowed to watch a digital versatile disc (DVD) movie through a screen.

When the multi-view display device is applied in the advertisement display field, three different pieces of information can be displayed according to directions in which pedestrians walk. Since the multi-view display device is capable of showing different images V1, V2, and V3 to two or more users, the space and cost are significantly saved in comparison to when two or more separate display devices are used.

Although not illustrated, a three-dimensional stereoscopic image may be realized when the multi-view display device is a dual-view display device configured to display two different images.

When images seen by two eyes are different due to the binocular disparity, the human brain accurately combines the two pieces of information, and a three-dimensional stereoscopic image can be formed. Such a three-dimensional stereoscopic image causes a person to feel a stereoscopic effect.

The multi-view display device may realize a privacy protection mode as illustrated in FIG. 2B. In the privacy protection mode, a private image V1 is only provided to a user who views the display panel 110 from the center, and a user who views the display panel 110 from the left or right views black images or noise images V2 and V3. In this case, the private image V1 is an image that the user wants to keep invisible to others for security or privacy.

Figure 3A:
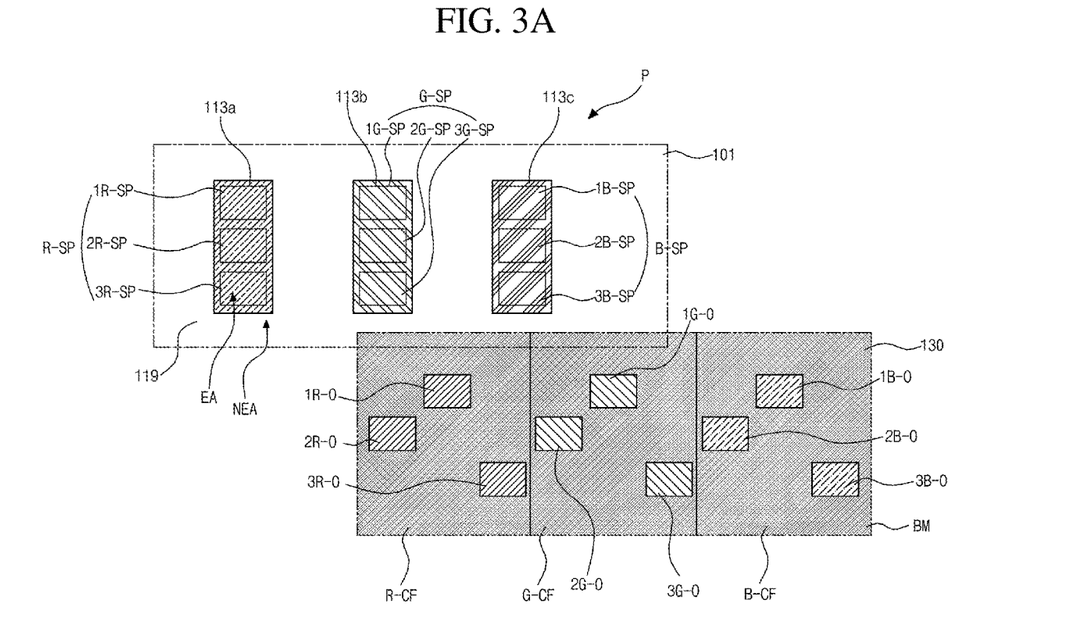
FIG. 3A is a plan view schematically illustrating an arrangement of an array substrate and a color filter encapsulation substrate which constitute a multi-view display device according to an aspect of the present disclosure.
Figure 3B:
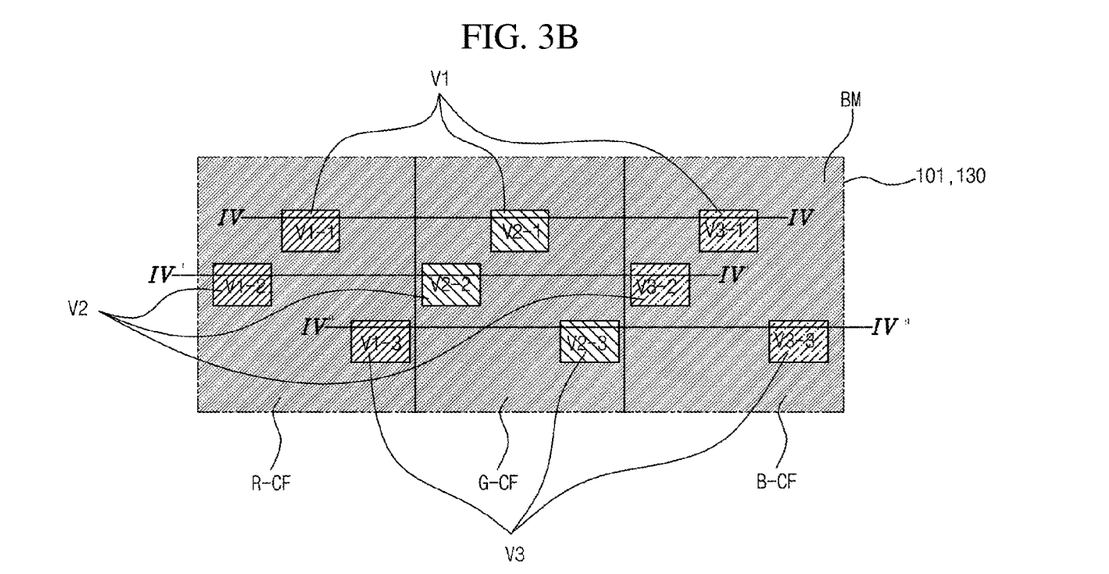
FIG. 3B is a plan view schematically illustrating a state in which an array substrate and a color filter encapsulation substrate overlap with each other according to an aspect of the present disclosure.

FIG. 3A is a plan view schematically illustrating an arrangement of an array substrate and a color filter encapsulation substrate which constitute a multi-view display device according to an aspect of the present disclosure, and FIG. 3B is a plan view schematically illustrating a state in which the array substrate and the color filter encapsulation substrate overlap each other.

In FIGS. 3A and 3B, for convenience of description, only a plurality of subpixels R-SP, G-SP, and B-SP which constitute a single unit pixel P and a bank 119 partitioning the plurality of subpixels R-SP, G-SP, and B-SP are illustrated on an array substrate 101, and only color filters R-CF, G-CF, and B-CF and a black matrix BM are illustrated on a color filter encapsulation substrate 130.

As illustrated in FIGS. 3A and 3B, the multi-view display device according to an aspect of the present disclosure may use an OLED device. The OLED device includes the array substrate 101 including a driving thin film transistor DTr (to be shown in FIG. 4A) and a light emitting diode (LED) E (to be shown in FIG. 4A), and the color filter encapsulation substrate 130 facing the array substrate 101.

In more detail, the OLED device includes a red subpixel R-SP, a green subpixel G-SP, and a blue subpixel B-SP arranged in a matrix form on the array substrate 101. The red subpixel R-SP may be defined by being divided into first to third red subpixels 1R-SP, 2R-SP, and 3R-SP along a longitudinal direction, the green subpixel G-SP may be defined by being divided into first to third green subpixels 1G-SP, 2G-SP, and 3G-SP along a longitudinal direction, and the blue subpixel B-SP are also defined by being divided into first to third blue subpixels 1B-SP, 2B-SP, and 3B-SP along a longitudinal direction.

The red subpixel R-SP, the green subpixel G-SP, and the blue subpixel B-SP neighboring one another constitute a single unit pixel P.

In the red, green, and blue subpixels R-SP, G-SP, and B-SP, each of the first to third red, green, and blue subpixels 1R-SP, 1G-SP, 1B-SP, 2R-SP, 2G-SP, 2B-SP, 3R-SP, 3G-SP, and 3B-SP includes an emissive region EA, and the bank 119 is disposed along an edge of each emissive region EA and forms a non-emissive region NEA.

In this case, for convenience of description, the subpixels 1R-SP, 1G-SP, 1B-SP, 2R-SP, 2G-SP, 2B-SP, 3R-SP, 3G-SP, and 3B-SP are illustrated as being disposed in parallel at equal widths. However, the subpixels 1R-SP, 1G-SP, 1B-SP, 2R-SP, 2G-SP, 2B-SP, 3R-SP, 3G-SP, and 3B-SP may be disposed at different widths and have various other structures.

In addition, a switching thin film transistor (not illustrated) and a driving thin film transistor DTr (to be shown in FIG. 4A) are disposed on the non-emissive region NEA of each of the subpixels 1R-SP, 1G-SP, 1B-SP, 2R-SP, 2G-SP, 2B-SP, 3R-SP, 3G-SP, and 3B-SP. An LED E (to be shown in FIG. 4A) which includes a first electrode 111 (to be shown in FIG. 4A), organic light emitting layer 113a, 113b, and 113c, and a second electrode 115 (to be shown in FIG. 4A) is disposed on the emissive region EA in each of the subpixels 1R-SP, 1G-SP, 1B-SP, 2R-SP, 2G-SP, 2B-SP, 3R-SP, 3G-SP, and 3B-SP.

In this case, red light is emitted from the red subpixel R-SP, green light is emitted from the green subpixel G-SP, and blue light is emitted from the blue subpixel B-SP such that the OLED device realizes full color spectrum.

To do this, in the OLED device according to an aspect of the present disclosure, the first to third organic light emitting layers 113a, 113b, and 113c configured to emit different colors are formed in the red subpixel R-SP, the green subpixel G-SP, and the blue subpixel B-SP, respectively.

In other words, in the first to third red subpixels 1R-SP, 2R-SP, and 3R-SP of the red subpixel R-SP, the first organic light emitting layer 113a configured to emit the same red light may be formed at an entire surface of the red subpixel R-SP. In the first to third green subpixels 1G-SP, 2G-SP, and 3G-SP of the green subpixel G-SP, the second organic light emitting layer 113b configured to emit the same green light may be formed at an entire surface of the green subpixel G-SP. In the first to third blue subpixels 1B-SP, 2B-SP, and 3B-SP of the blue subpixel B-SP, the third organic light emitting layer 113c configured to emit the same blue light may be formed at an entire surface of the blue subpixel B-SP.

Therefore, the OLED device of this aspect may be capable of realizing multiple views without using a fine metal mask (FMM).

A plurality of black matrices BM and a plurality of color filters R-CF, G-CF, and B-CF are disposed on the color filter encapsulation substrate 130 facing the array substrate 101. The black matrix BM and the color filters R-CF, G-CF, and B-CF may serve as barriers configured to spatially separate the red light, green light, and blue light emitted from the first to third red, green, and blue subpixels 1R-SP, 1G-SP, 1B-SP, 2R-SP, 2G-SP, 2B-SP, 3R-SP, 3G-SP, and 3B-SP.

In other words, regarding the color filters R-CF, G-CF, and B-CF disposed on the color filter encapsulation substrate 130, the red color filter R-CF is disposed corresponding to the red subpixel R-SP, the green color filter G-CF is disposed corresponding to the green subpixel G-SP, and the blue color filter B-CF is disposed corresponding to the blue subpixel B-SP.

In addition, the black matrices BM having first to third openings 1R-O, 2R-O, 3R-O, 1G-O, 2G-O, 3G-O, 1B-O, 2B-O, and 3B-O which are spaced apart at predetermined intervals in a longitudinal direction of the red, green, and blue color filters R-CF, G-CF, and B-CF are disposed. The black matrices BM disposed corresponding to the red color filter R-CF may include a first red opening 1R-O corresponding to the first red subpixel 1R-SP, a second red opening 2R-O corresponding to the second red subpixel 2R-SP, and a third red opening 3R-O corresponding to the third red subpixel 3R-SP. The black matrices BM disposed corresponding to the green color filter G-CF may include a first green opening 1G-O corresponding to the first green subpixel 1G-SP, a second green opening 2G-O corresponding to the second green subpixel 2G-SP, and a third green opening 3G-O corresponding to the third green subpixel 3G-SP. The black matrices BM disposed corresponding to the blue color filter B-CF may include a first blue opening 1B-O corresponding to the first blue subpixel 1B-SP, a second blue opening 2B-O corresponding to the second blue subpixel 2B-SP, and a third blue opening 3B-O corresponding to the third blue subpixel 3B-SP.

In this case, the first red, green, and blue openings 1R-O, 1G-O, and 1B-O corresponding to the first red, green, and blue subpixels 1R-SP, 1G-SP, and 1B-SP may be disposed at the central portions of the first red, green, and blue subpixels 1R-SP, 1G-SP, and 1B-SP. The second red, green, and blue openings 2R-O, 2G-O, and 2B-O corresponding to the second red, green, and blue subpixels 2R-SP, 2G-SP, and 2B-SP may be disposed toward the left from the central portions of the second red, green, and blue subpixels 2R-SP, 2G-SP, and 2B-SP. The third red, green, and blue openings 3R-O, 3G-O, and 3B-O corresponding to the third red, green, and blue subpixels 3R-SP, 3G-SP, and 3B-SP may be disposed toward the right from the central portions of the third red, green, and blue subpixels 3R-SP, 3G-SP, and 3B-SP.

Therefore, in the OLED device of this aspect, the red light emitted from the red subpixel R-SP may display the first-first (i.e., 1-1) to first-third (i.e., 1-3) view images V1-1, V1-2, and V1-3 through the first to third red openings 1R-O, 2R-O, and 3R-O. The green light emitted from the green subpixel G-SP may display the second-first (i.e., 2-1) to second-third (i.e., 2-3) view images V2-1, V2-2, and V2-3 through the first to third green openings 1G-O, 2G-O, and 3G-O. The blue light emitted from the blue subpixel B-SP may display the third-first (i.e., 3-1) to third-third (i.e., 3-3) view images V3-1, V3-2, and V3-3 through the first to third blue openings 1B-O, 2B-O, and 3B-O.

In this case, the first-first view image V1-1, the second-first view image V2-1, and the third-first view image V3-1 may form a single first view image V1. The first-second view image V1-2, the second-second view image V2-2, and the third-second view image V3-2 may form a single second view image V2. The first-third view image V1-3, the second-third view image V2-3, and the third-third view image V3-3 may form a single third view image V3.

Accordingly, the single unit pixel P of this aspect may display three view images of the first to third view images V1, V2, and V3 which are defined by being divided into nine view images.

Accordingly, the OLED device of this aspect realizes a multi-view display device.

This will be described in more detail below with reference to FIGS. 4A to 4C.

Figure 4A:
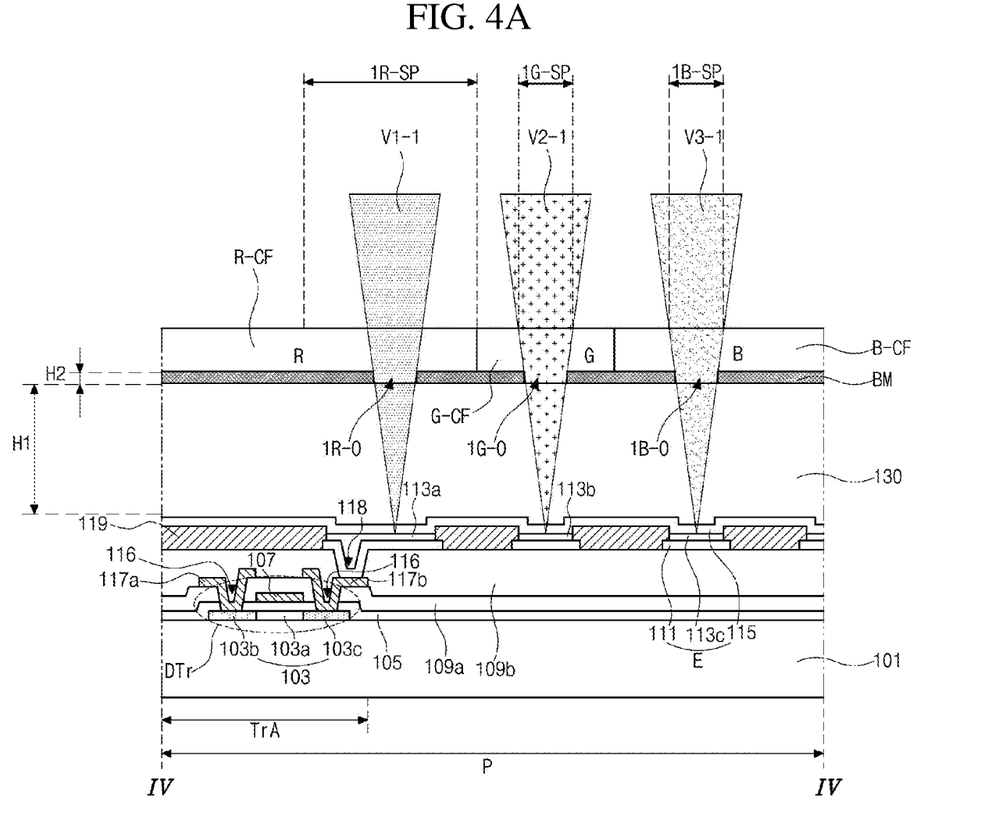
FIGS. 4A to 4C are cross-sectional views respectively taken along line IV-IV, line IV'-IV', and line IV''-IV'' of FIG. 3B.
Figure 4B:
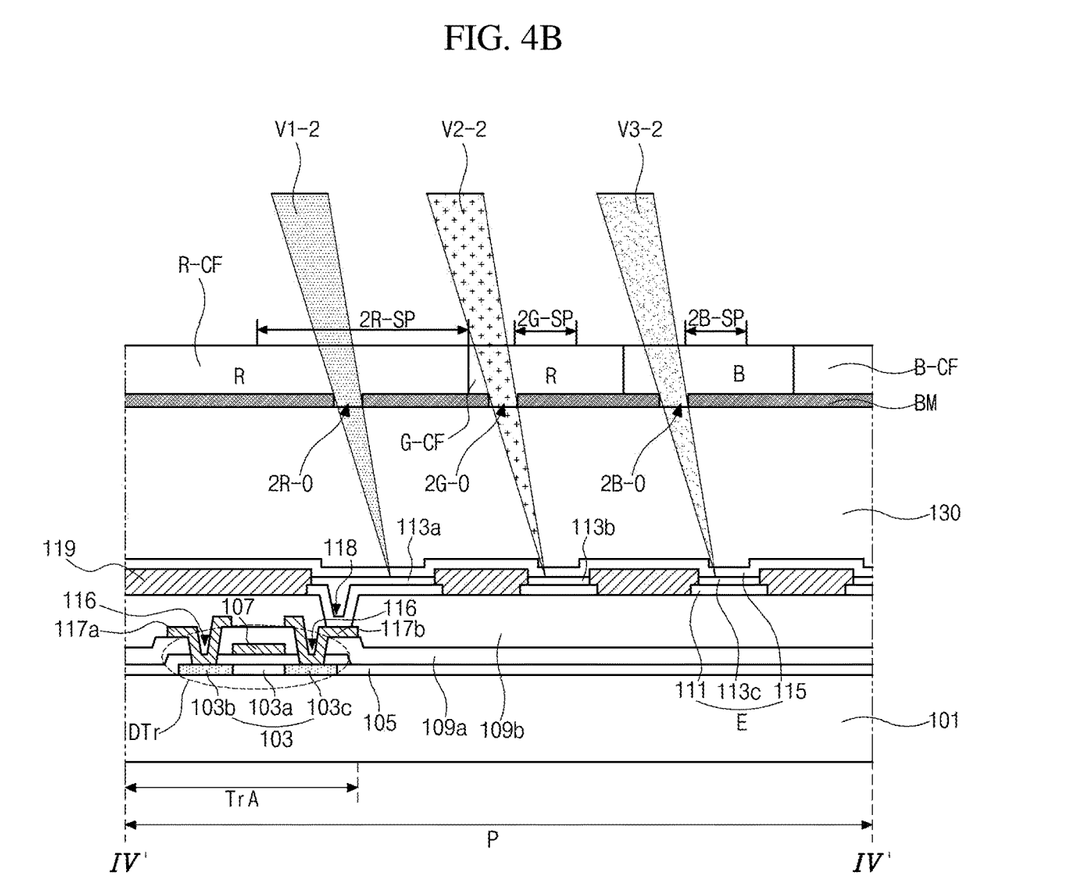
Figure 4C:
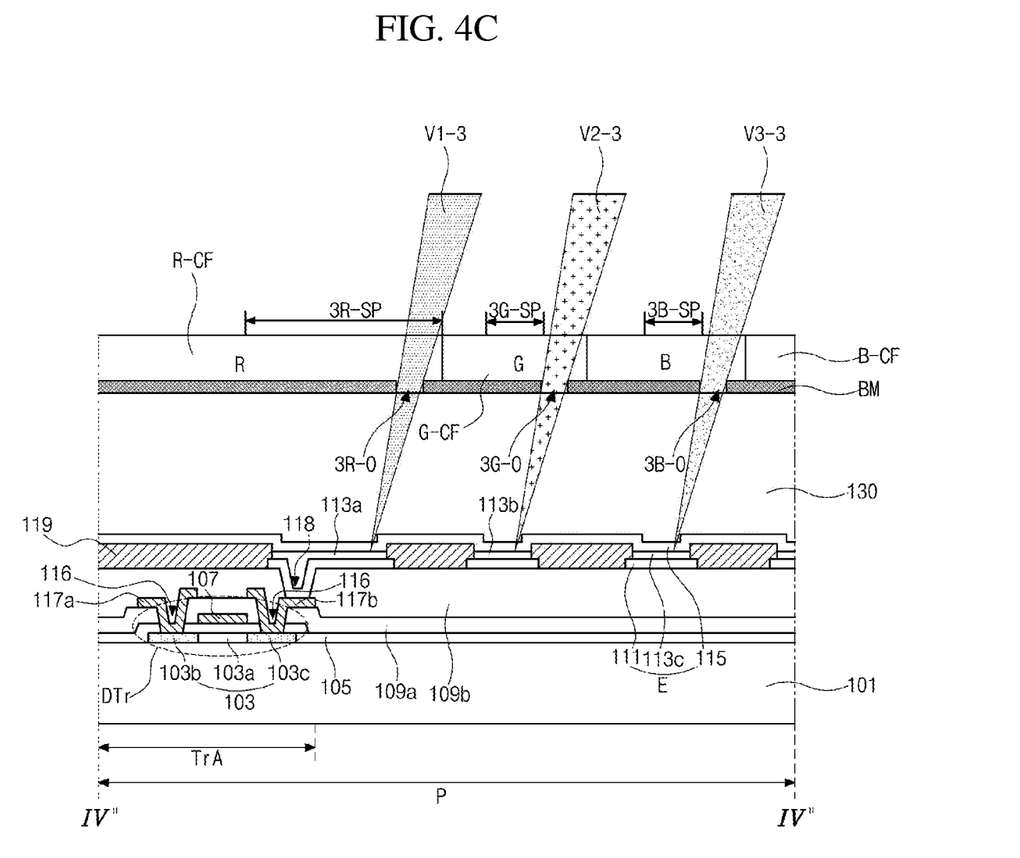
Figure 5A:
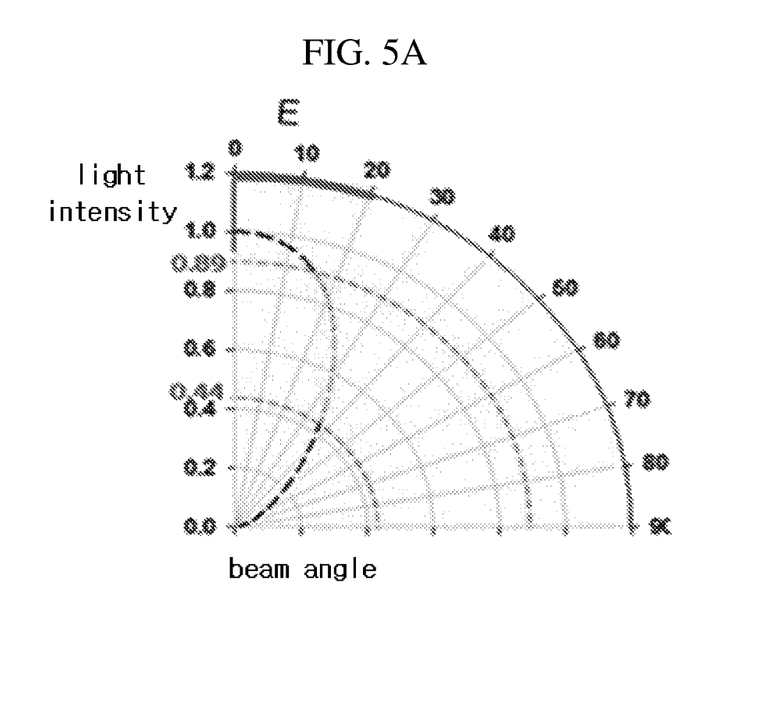
FIGS. 5A and 5B are graphs of experimental results showing beam angles of light emitted from subpixels according to an aspect of the present disclosure.
Figure 5B:
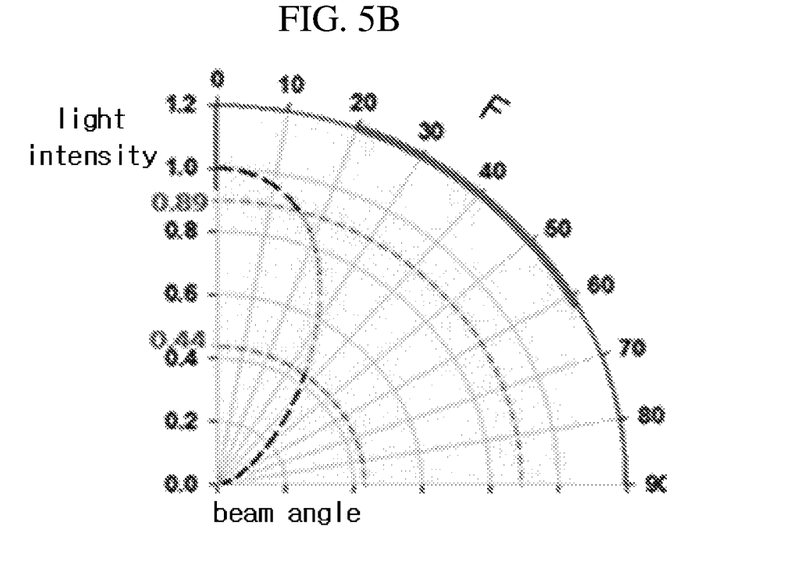

FIGS. 4A to 4C are cross-sectional views respectively taken along line IV-IV, line IV'-IV', and line IV"-IV" of FIG. 3B, and FIGS. 5A and 5B are graphs of experimental results showing beam angles of light emitted from subpixels.

The OLED device according to an aspect of the present disclosure is classified into a top emission type and a bottom emission type according to a light transmission direction thereof. Hereinafter, for convenience, an example in which the OLED device is a top emission type will be described.

As illustrated in FIGS. 4A to 4C, the OLED device according to an aspect of the present disclosure includes an array substrate 101 on which a driving thin film transistor DTr and an LED E are formed and a color filter encapsulation substrate 130 facing the array substrate 101. The array substrate 101 and the color filter encapsulation substrate 130 are adhered to each other, thereby forming the OLED device.

In more detail, a gate line (not illustrated), a data line (not illustrated), and a power line (not illustrated) are disposed on the array substrate 101 such that each of the subpixels 1R-SP, 1G-SP, 1B-SP, 2R-SP, 2G-SP, 2B-SP, 3R-SP, 3G-SP, and 3B-SP are defined.

The plurality of subpixels 1R-SP, 1G-SP, 1B-SP, 2R-SP, 2G-SP, 2B-SP, 3R-SP, 3G-SP, and 3B-SP include red subpixels 1R-SP, 2R-SP, and 3R-SP, green subpixels 1G-SP, 2G-SP, and 3G-SP, and blue subpixels 1B-SP, 2B-SP, and 3B-SP, and the red, blue, and green subpixels 1R-SP, 1G-SP, 1B-SP, 2R-SP, 2G-SP, 2B-SP, 3R-SP, 3G-SP, and 3B-SP constitute a single unit pixel P.

In this case, the red, green, and blue subpixels 1R-SP, 1G-SP, 1B-SP, 2R-SP, 2G-SP, 2B-SP, 3R-SP, 3G-SP, and 3B-SP may be defined by being divided into the first to third red subpixels 1R-SP, 2R-SP, and 3R-SP which may be trisected at equal widths in a longitudinal direction, the first to third green subpixels 1G-SP, 2G-SP, and 3G-SP which may be trisected at equal widths in a longitudinal direction, and the first to third blue subpixels 1B-SP, 2B-SP, and 3B-SP which may be trisected at equal widths in a longitudinal direction.

In this case, referring to FIG. 4A (which is a cross-sectional view taken along line IV-IV and schematically illustrates the first red, green, and blue subpixels 1R-SP, 1G-SP, and 1B-SP), FIG. 4B (which is a cross-sectional view taken along line IV'-IV' and schematically illustrates the second red, green, and blue subpixels 2R-SP, 2G-SP, and 2B-SP), and FIG. 4C (which is a cross-sectional view taken along line IV"-IV" and schematically illustrates the third red, green, and blue subpixels 3R-SP, 3G-SP, and 3B-SP), a semiconductor layer 103 is disposed on a switching region TrA of each of the subpixels 1R-SP, 1G-SP, 1B-SP, 2R-SP, 2G-SP, 2B-SP, 3R-SP, 3G-SP, and 3B-SP on the array substrate 101. The semiconductor layer 103 may be formed of silicon. The semiconductor layer 103 may include an active region 103a as a channel at a center portion thereof, and source and drain regions 103b and 103c doped with high-concentration impurities at both sides of the active region 103a.

A gate insulating layer 105 is disposed on the semiconductor layer 103.

A gate electrode 107 corresponding to the active region 103a of the semiconductor layer 103 and a gate line (not illustrated) which extends in one direction are disposed on the gate insulating layer 105.

An interlayer insulating layer 109a is disposed on the gate electrode 107 and the gate line. In this case, first and second semiconductor layer contact holes 116 configured to respectively expose the source and drain regions 103b and 103c are disposed in the interlayer insulating layer 109a and the gate insulating layer 105.

Source and drain electrodes 117a and 117b spaced apart from each other and respectively in contact with the source and drain regions 103b and 103c through the first and second semiconductor layer contact holes 116 are disposed on the interlayer insulating layer 109a.

A passivation layer 109b having a drain contact hole 118 configured to expose the drain electrode 117b of the driving thin film transistor DTr is disposed on the source and drain electrodes 117a and 117b and the interlayer insulating layer 109a.

In this case, the source and drain electrodes 117a and 117b, the semiconductor layer 103, the gate insulating layer 105, and the gate electrode 107 constitute the driving thin film transistor DTr.

Although not illustrated in the drawings, a switching thin film transistor is connected to the driving thin film transistor DTr. The switching thin film transistor may be formed of the same structure as the driving thin film transistor DTr.

In this aspect, the driving thin film transistor DTr having a top gate structure with the semiconductor layer 103 formed as a polycrystalline silicon layer or oxide semiconductor layer is described by way of example. Alternatively, the driving thin film transistor DTr may have a bottom gate structure with the semiconductor layer 103 formed as an amorphous silicon layer.

When the semiconductor layer 103 is formed as the oxide semiconductor layer, a light shielding layer (not illustrated) may be disposed below the semiconductor layer 103. A buffer layer (not illustrated) may be disposed between the light shielding layer and the semiconductor layer 103.

A first electrode 111 connected to the drain electrode 117b of the driving thin film transistor DTr and serving as an anode of the LED E with, for example, a material having a relatively high work function, is disposed on the passivation layer 109b.

The first electrode 111 may be formed of metal oxide such as indium tin oxide (ITO) and indium zinc oxide (IZO).

The first electrode 111 may be disposed for each of the subpixels 1R-SP, 1G-SP, 1B-SP, 2R-SP, 2G-SP, 2B-SP, 3R-SP, 3G-SP, and 3B-SP. A bank 119 may be disposed between the first electrodes 111 disposed in the subpixels R-SP, G-SP, and B-SP.

In other words, the first electrodes 111 may have separated structures for each of the subpixels R-SP, G-SP, and B-SP with the bank 119 as boundaries for each of the subpixels 1R-SP, 1G-SP, 1B-SP, 2R-SP, 2G-SP, 2B-SP, 3R-SP, 3G-SP, and 3B-SP.

In addition, the organic light emitting layers 113a, 113b, and 113c may be disposed on the first electrodes 111 when the bank 119 is formed. The organic light emitting layers 113a, 113b, and 113c emit red light, green light, and blue light in the red, green, and blue subpixels 1R-SP, 1G-SP, 1B-SP, 2R-SP, 2G-SP, 2B-SP, 3R-SP, 3G-SP, and 3B-SP.

In this regard, the organic light emitting layer 113a in the red subpixels 1R-SP, 2R-SP, and 3R-SP is a first organic light emitting layer 113a configured to emit red light, the organic light emitting layer 113b in the green subpixels 1G-SP, 2G-SP, and 3G-SP is a second organic light emitting layer 113b configured to emit green light, and the organic light emitting layer 113c in the blue subpixels 1B-SP, 2B-SP, and 3B-SP is a third organic light emitting layer 113c configured to emit blue light.

In other words, the first organic light emitting layer 113a is disposed on the first to third red subpixels 1R-SP, 2R-SP, and 3R-SP so that all of the first to third red subpixels 1R-SP, 2R-SP, and 3R-SP emit red light. The second organic light emitting layer 113b is disposed on the first to third green subpixels 1G-SP, 2G-SP, and 3G-SP so that all of the first to third green subpixels 1G-SP, 2G-SP, and 3G-SP emit green light. The third organic light emitting layer 113c is disposed on the first to third blue subpixels 1B-SP, 2B-SP, and 3B-SP so that all of the first to third blue subpixels 1B-SP, 2B-SP, and 3B-SP emit blue light.

The first to third organic light emitting layers 113a, 113b, and 113c may be formed of a single layer formed of an emitting material. To improve luminous efficiency, the first to third organic light emitting layers 113a, 113b, and 113c may be formed of multiple layers including a hole injection layer, a hole transport layer, an emitting material layer, an electron transport layer, and an electron injection layer.

A second electrode 115 serving as a cathode may be disposed entirely on the organic light emitting layers 113a, 113b, and 113c.

The second electrode 115 may be formed of a material having a relatively low work function. The second electrode 115 may be formed with a single layer or multiple layers using a first metal such as Ag and a second metal such as Mg, and the single layer may be made of an alloy of the first and second metals at a predetermined ratio thereof.

In the OLED device, when predetermined voltages are applied to the first electrode 111 and the second electrode 115, the holes injected from the first electrode 111 and the electrons provided from the second electrode 115 are transported to the organic light emitting layers 113a, 113b, and 113c and form excitons, and when such excitons are transitioned from an excited state to a ground state, light is generated and emitted in the form of visible light.

The OLED device according to an aspect of the present disclosure is a top emission type in which light emitted from the organic light emitting layers 113a, 113b, and 113c is output to the outside through the second electrode 115. In this case, the first electrode 111 further includes a reflective layer (not illustrated) formed of an opaque conductive material. For example, the reflective layer may be formed of an aluminum-palladium-copper (APC) alloy, and the first electrode 111 may have a triple layer structure of ITO/APC/ITO.

The second electrode 115 may be formed of a semi-transmissive conductive material such as Mg, Ag, or an alloy of Mg and Ag. When the second electrode 115 is formed of a semi-transmissive conductive material, light output efficiency may be improved by a micro cavity.

In this case, in the OLED device according to an aspect of the present disclosure, the first to third red, green, and blue subpixels 1R-SP, 1G-SP, 1B-SP, 2R-SP, 2G-SP, 2B-SP, 3R-SP, 3G-SP, and 3B-SP may have different micro cavity depths. This will be described in more detail below.

A capping layer (not illustrated) may be formed on the second electrode 115.

The color filter encapsulation substrate 130, which is in the form of a thin film, is formed on the driving thin film transistor DTr and the LED E, and the OLED device is encapsulated by the color filter encapsulation substrate 130.

To prevent permeation of external oxygen and moisture into the OLED device, at least two inorganic protective films are stacked to form the color filter encapsulation substrate 130. In this case, an organic protective film for supplementing impact resistance of the two inorganic protective films may be interposed between the inorganic protective films.

In such the structure in which the organic protective film and the inorganic protective films are alternately stacked repeatedly, in order to prevent moisture and oxygen from permeating through side surfaces of the organic protective film, the inorganic protective films may completely cover the organic protective film.

Accordingly, the OLED device can prevent permeation of moisture and oxygen thereinto from the outside.

In this case, in the OLED device according to an aspect of the present disclosure, the first to third color filters R-CF, G-CF, and B-CF and a barrier layer including black matrices BM are disposed on the color filter encapsulation substrate 130. The black matrices BM may not overlap with the first red, green, and blue subpixels 1R-SP, 1G-SP, and 1B-SP and may completely overlap with the second and third red, green, and blue subpixels 2R-SP, 2G-SP, 2B-SP, 3R-SP, 3G-SP, and 3B-SP.

In other words, the first red, green, and blue openings 1R-O, 1G-O, and 1B-O of the black matrices BM may be disposed corresponding to the first red, green, and blue subpixels 1R-SP, 1G-SP, and 1B-SP, respectively. The second red, green, and blue openings 2R-O, 2G-O, and 2B-O may be disposed toward the left from the centers of the second red, green, and blue subpixels 2R-SP, 2G-SP, and 2B-SP, respectively. The third red, green, and blue openings 3R-O, 3G-O, and 3B-O may be disposed toward the right from the centers of the third red, green, and blue subpixels 3R-SP, 3G-SP, and 3B-SP, respectively.

In this case, in more detail regarding the second and third red, green and blue openings 2R-O, 2G-O, 2B-O, 3R-O, 3G-O, and 3B-O, the second green opening 2G-O may be shifted toward the second red subpixel 2R-SP from the second green subpixel 2G-SP and disposed on the bank 119 between the second red subpixel 2R-SP and the second green subpixel 2G-SP, and the second blue opening 2B-O may be shifted toward the second green subpixel 2G-SP from the second blue subpixel 2B-SP and disposed on the bank 119 between the second green subpixel 2G-SP and the second blue subpixel 2B-SP.

In addition, the third red opening 3R-O may be shifted toward the third green subpixel 3G-SP from the third red subpixel 3R-SP and disposed on the bank 119 between the third red subpixel 3R-SP and the third green subpixel 3G-SP, and the third green opening 3G-O may be shifted toward the third blue subpixel 3B-SP from the third green subpixel 3G-SP and disposed on the bank 119 between the third green subpixel 3G-SP and the third blue subpixel 3B-SP.

Similarly, the third blue opening 3B-O may be disposed on the bank 119 disposed between the third blue subpixel 3B-SP and a neighboring subpixel to the right thereof.

In this case, the second red opening 2R-O is illustrated as being disposed in the second red subpixel 2R-SP, but this is merely for illustrating the driving thin film transistor DTr in the drawings. The second red opening 2R-O may substantially be disposed on the bank 119 disposed between the second red subpixel 2R-SP and a neighboring subpixel to the left thereof.

A width of such a black matrix BM including the first to third red, green, and blue openings 1R-O, 1G-O, 1B-O, 2R-O, 2G-O, 2B-O, 3R-O, 3G-O, and 3B-O may have a value equal to (width of each subpixel 1R-SP, 1G-SP, 1B-SP, 2R-SP, 2G-SP, 2B-SP, 3R-SP, 3G-SP, and 3B-SP*0.5). When the width of the black matrix BM has a value less than (width of each subpixel 1R-SP, 1G-SP, 1B-SP, 2R-SP, 2G-SP, 2B-SP, 3R-SP, 3G-SP, and 3B-SP*0.5), light may be mixed and output to neighboring subpixels 1R-SP, 1G-SP, 1B-SP, 2R-SP, 2G-SP, 2B-SP, 3R-SP, 3G-SP, and 3B-SP, and it may become difficult for the OLED device to realize multiple views.

The widths of the subpixels 1R-SP, 1G-SP, 1B-SP, 2R-SP, 2G-SP, 2B-SP, 3R-SP, 3G-SP, and 3B-SP and the widths of the black matrices BM may be changed by varying the distance between the array substrate 101 and the color filter encapsulation substrate 130.

Particularly, the widths of the first to third red, green, and blue openings 1R-O, 1G-O, 1B-O, 2R-O, 2G-O, 2B-O, 3R-O, 3G-O, and 3B-O and the widths of the color filters R-CF, G-CF, and B-CF may be changed according to a cell gap H1, which is the distance between the array substrate 101 and the color filter encapsulation substrate 130, and a thickness H2 of the black matrices BM. This may be designed within a range that satisfies the following equation 1.

$$(\text{cell gap} + \text{black matrix thickness}) * \tan(60°) < (\text{subpixel width} * 1.5) \quad \text{(Equation 1)}$$

In this case, the widths of the first red, green, and blue openings 1R-O, 1G-O, and 1B-O corresponding to the first red, green, and blue subpixels 1R-SP, 1G-SP, and 1B-SP satisfy (cell gap+black matrix thickness)*tan(20°)*2. The widths of the second and third red, green, and blue openings 2R-O, 2G-O, 2B-O, 3R-O, 3G-O, and 3B-O corresponding to the second and third red, green, and blue subpixels 2R-SP, 2G-SP, 2B-SP, 3R-SP, 3G-SP, and 3B-SP satisfy (cell gap+black matrix thickness)*tan(60°).

In this case, 20° and 60° are beam angles (=viewing angles) of light emitted from each of the subpixels 1R-SP, 1G-SP, 1B-SP, 2R-SP, 2G-SP, 2B-SP, 3R-SP, 3G-SP, and 3B-SP. Referring to FIG. 5A, light emitted from each of the subpixels 1R-SP, 1G-SP, 1B-SP, 2R-SP, 2G-SP, 2B-SP, 3R-SP, 3G-SP, and 3B-SP is emitted forward with a beam angle of about 40° (marked as region E).

In other words, all of red light, green light, and blue light emitted from the first red, blue, and green subpixels 1R-SP, 1G-SP, and 1B-SP travel forward toward the color filter encapsulation substrate 130 with a beam angle in a range of −20 to +20°.

Referring to FIG. 5B, all of red light, green light, and blue light emitted from the second and third red, green, and blue subpixels 2R-SP, 2G-SP, 2B-SP, 3R-SP, 3G-SP, and 3B-SP travel sideward toward the color filter encapsulation substrate 130 with a beam angle in a range of −60 to −20° and +20 to +60° (marked as region F).

In this case, referring to FIGS. 5A and 5B, for light emitted from each of the subpixels 1R-SP, 1G-SP, 1B-SP, 2R-SP, 2G-SP, 2B-SP, 3R-SP, 3G-SP, and 3B-SP, a luminance of light emitted forward is the highest, and a luminance of light emitted sideward is lower than that of light emitted forward.

Accordingly, the widths of the first red, green, and blue openings 1R-O, 1G-O, and 1B-O disposed corresponding to the first red, green, and blue subpixels 1R-SP, 1G-SP, and 1B-SP which emit light forward may satisfy (cell gap+black matrix thickness)*tan(20°)*2, and the second and third red, green, and blue openings 2R-O, 2G-O, 2B-O, 3R-O, 3G-O, and 3B-O disposed corresponding to the second and third red, green, and blue subpixels 2R-SP, 2G-SP, 2B-SP, 3R-SP, 3G-SP, and 3B-SP may have widths that satisfy (cell gap+black matrix thickness)*tan(60°).

Regarding the color filters R-CF, G-CF, and B-CF disposed on the color filter encapsulation substrate 130, the red color filter R-CF is disposed corresponding to the red subpixels 1R-SP, 2R-SP, and 3R-SP, the green color filter G-CF is disposed corresponding to the green subpixels 1G-SP, 2G-SP, and 3G-SP, and the blue color filter B-CF is disposed corresponding to the blue subpixels 1B-SP, 2B-SP, and 3B-SP.

In other words, all of the first to third red subpixels 1R-SP, 2R-SP, and 3R-SP of the red subpixels 1R-SP, 2R-SP, and 3R-SP are disposed to overlap with the red color filter R-CF, all of the first to third green subpixels 1G-SP, 2G-SP, and 3G-SP of the green subpixels 1G-SP, 2G-SP, and 3G-SP are disposed to overlap with the green color filter G-CF, and all of the first to third blue subpixels 1B-SP, 2B-SP, and 3B-SP of the blue subpixels 1B-SP, 2B-SP, and 3B-SP are disposed to overlap with the blue color filter B-CF.

Accordingly, when different data signals are applied to the subpixels 1R-SP, 1G-SP, 1B-SP, 2R-SP, 2G-SP, 2B-SP, 3R-SP, 3G-SP, and 3B-SP, light emitted from the first red subpixel 1R-SP among the red subpixels 1R-SP, 2R-SP, and 3R-SP passes through the red color filter R-CF through the first red opening 1R-O and displays the first-first view image V1-1, light emitted from the second red subpixel 2R-SP among the red subpixels 1R-SP, 2R-SP, and 3R-SP passes through the red color filter R-CF through the second red opening 2R-O and displays the first-second view image V1-2, and light emitted from the third red subpixel 3R-SP among the red subpixels 1R-SP, 2R-SP, and 3R-SP passes through the red color filter R-CF through the third red opening 3R-O and displays the first-third view image V1-3.

In addition, light emitted from the first green subpixel 1G-SP among the green subpixels 1G-SP, 2G-SP, and 3G-SP passes through the green color filter G-CF through the first green opening 1G-O and displays the second-first view image V2-1, light emitted from the second green subpixel 2G-SP among the green subpixels 1G-SP, 2G-SP, and 3G-SP passes through the green color filter G-CF through the second green opening 2G-O and displays the second-second view image V2-2, and light emitted from the third green subpixel 3G-SP among the green subpixels 1G-SP, 2G-SP, and 3G-SP passes through the green color filter G-CF through the third green opening 3G-O and displays the second-third view image V2-3.

In addition, light emitted from the first blue subpixel 1B-SP among the blue subpixels 1B-SP, 2B-SP, and 3B-SP passes through the blue color filter B-CF through the first blue opening 1B-O and displays the third-first view image V3-1, light emitted from the second blue subpixel 2B-SP among the blue subpixels 1B-SP, 2B-SP, and 3B-SP passes through the blue color filter B-CF through the second blue opening 2B-O and displays the third-second view image V3-2, and light emitted from the third blue subpixel 3B-SP among the blue subpixels 1B-SP, 2B-SP, and 3B-SP passes through the blue color filter B-CF through the third blue opening 3B-O and displays the third-third view image V3-3.

In this case, the first-first view image V1-1 displayed through the red color filter R-CF, the second-first view image V2-1 displayed through the green color filter G-CF, and the third-first view image V3-1 displayed through the blue color filter B-CF realize the first view image V1. Similarly, the first-second view image V1-2, the second-second view image V2-2, and the third-second view image V3-2 realize the second view image V2, and the first-third view image V1-3, the second-third view image V2-3, and the third-third view image V3-3 realize the third view image V3.

Accordingly, the OLED device of this aspect realizes the multi-view display device.

In other words, in the OLED according to this aspect, in addition to the subpixels 1R-SP, 1G-SP, 1B-SP, 2R-SP, 2G-SP, 2B-SP, 3R-SP, 3G-SP, and 3B-SP and the color filters R-CF, G-CF, and B-CF being used, the gaps between the subpixels 1R-SP, 1G-SP, 1B-SP, 2R-SP, 2G-SP, 2B-SP, 3R-SP, 3G-SP, and 3B-SP are adjusted, and positions of the openings 1R-O, 1G-O, 1B-O, 2R-O, 2G-O, 2B-O, 3R-O, 3G-O, and 3B-O of the black matrices BM are adjusted. Accordingly, the first-first to first-third view images V1-1, V1-2, and V1-3 displayed from the red subpixels 1R-SP, 2R-SP, and 3R-SP are output to regions of first to third view images V1, V2, and V3, respectively, and the second-first to second-third view images V2-1, V2-2, and V2-3 displayed from the green subpixels 1G-SP, 2G-SP, and 3G-SP are output to regions of the first to third view images V1, V2, and V3, respectively.

The third-first to third-third view images V3-1, V3-2, and V3-3 displayed from the blue subpixels 1B-SP, 2B-SP, and 3B-SP are output to regions of the first to third view images V1, V2, and V3, respectively.

This means that the first-first to first-third view images V1-1, V1-2, and V1-3 of red light may be output to the regions of the first to third view images V1, V2, and V3, respectively, using the first to third red subpixels 1R-SP, 2R-SP, and 3R-SP, the second-first to second-third view images V2-1, V2-2, and V2-3 of green light may be output to the regions of the first to third view images V1, V2, and V3, respectively, using the first to third green subpixels 1G-SP, 2G-SP, and 3G-SP, and the third-first to third-third view images V3-1, V3-2, and V3-3 of blue light may be output to the regions of the first to third view images V1, V2, and V3, respectively, using the first to third blue subpixels 1B-SP, 2B-SP, and 3B-SP.

The first-first view image V1-1, the second-first view image V2-1, and the third-first view images V3-1 realize the first view image V1. The second-first view images V2-1, the second-second view images V2-2, and the second-third view images V2-3 realize the second view images V2. The first-third view images V1-3, the second-third view images V2-3, and the third-third view images V3-3 realize the third view images V3.

Accordingly, since the OLED device according to an aspect of the present disclosure may realize multiple views, a triple-view display device may be realized using a single display device, and a three-dimensional stereoscopic image may also be realized using a single display device.

In addition, since a privacy protection mode may be realized, one's privacy or information can be protected.

Particularly, in the OLED device of the aspect realizing a multi-view display device, the first to third red subpixels 1R-SP, 2R-SP, and 3R-SP configured to display the first-first to first-third view images V1-1, V1-2, and V1-3 are defined by dividing the red subpixels 1R-SP, 2R-SP, and 3R-SP on which the first organic light emitting layer 113a is deposited, the first to third green subpixels 1G-SP, 2G-SP, and 3G-SP configured to display the second-first to second-third view images V2-1, V2-2, and V2-3 are defined by dividing the green subpixels 1G-SP, 2G-SP, and 3G-SP on which the second organic light emitting layer 113b is deposited, and the first to third blue subpixels 1B-SP, 2B-SP, and 3B-SP configured to display the third-first to third-third view images V3-1, V3-2, and V3-3 are defined by dividing the blue subpixels 1B-SP, 2B-SP, and 3B-SP on which the third organic light emitting layer 113c is deposited. Therefore, it is not required to respectively form the organic light emitting layers 113a, 113b, and 113c in all of the subpixels 1R-SP, 1G-SP, 1B-SP, 2R-SP, 2G-SP, 2B-SP, 3R-SP, 3G-SP, and 3B-SP for realizing the first-first to third-third view images V1-1, V1-2, V1-3, V2-1, V2-2, V2-3, V3-1, V3-2, and V3-3, and the process efficiency can be improved.

Even without using an FMM, the size of the OLED device of this aspect may be increased, the lifetime thereof may be extended, and power consumption thereof may be reduced.

When the FMM is used in a process of forming the first to third organic light emitting layers 113a, 113b, and 113c, more view images may be realized and thus more various multiple views may be realized.

Referring back to FIGS. 5A and 5B, since the OLED device according to an aspect of the present disclosure uses light emitted forward from the first red, green, and blue subpixels 1R-SP, 1G-SP, and 1B-SP and uses light emitted sideward from the second and third red, green, and blue subpixels 2R-SP, 2G-SP, 2B-SP, 3R-SP, 3G-SP, and 3B-SP, a luminance difference occurs between the light emitted from the first red, green, and blue subpixels 1R-SP, 1G-SP, and 1B-SP, and the light emitted from the second and third red, green, and blue subpixels 2R-SP, 2G-SP, 2B-SP, 3R-SP, 3G-SP, and 3B-SP.

Accordingly, in order to realize a micro cavity effect with the second electrode 115 of the LED E made of a semi-transmissive conductive material, a micro cavity depth differs for each of the first red, green, and blue subpixels 1R-SP, 1G-SP, and 1B-SP and the second and third red, green, and blue subpixels 2R-SP, 2G-SP, 2B-SP, 3R-SP, 3G-SP, and 3B-SP.

The micro cavity effect refers to an effect in which lights reflected between mirrors are destructively or constructively interfered with each other, only a light having a specific wavelength remains and a light having other wavelengths is cancelled, thereby increasing intensity of a light having a specific wavelength.

In order to realize the micro cavity effect, a depth or length of a micro cavity between the first electrode 111 and the second electrode 115 or between the first and second electrodes 111 and 115 and the EML of the organic light emitting layers 113a, 113b or 113c may be configured for each of the red, green, and blue subpixels 1R-SP, 1G-SP, 1B-SP, 2R-SP, 2G-SP, 2B-SP, 3R-SP, 3G-SP, and 3B-SP such that a resonant wavelength corresponding to a desired peak color wavelength.

In this case, an efficient micro cavity depth may be defined using an optical length which is a wavelength. Since a wavelength of red light is greater than a wavelength of green light, a micro cavity depth of the red subpixels 1R-SP, 2R-SP, and 3R-SP may be configured to be greater than a micro cavity depth of the green subpixels 1G-SP, 2G-SP, and 3G-SP.

Since a wavelength of green light is greater than a wavelength of blue light, a micro cavity depth of the green subpixels 1G-SP, 2G-SP, and 3G-SP may be configured to be greater than a micro cavity depth of the blue subpixels 1B-SP, 2B-SP, and 3B-SP.

Particularly, in the OLED device of this aspect, the red, green, and blue subpixels 1R-SP, 1G-SP, 1B-SP, 2R-SP, 2G-SP, 2B-SP, 3R-SP, 3G-SP, and 3B-SP are defined by being divided into first to third red, green, and blue subpixels 1R-SP, 1G-SP, 1B-SP, 2R-SP, 2G-SP, 2B-SP, 3R-SP, 3G-SP, and 3B-SP, and the first to third red, green, and blue subpixels 1R-SP, 1G-SP, 1B-SP, 2R-SP, 2G-SP, 2B-SP, 3R-SP, 3G-SP, and 3B-SP display different view images. Accordingly, even in the red, green, and blue subpixels 1R-SP, 1G-SP, 1B-SP, 2R-SP, 2G-SP, 2B-SP, 3R-SP, 3G-SP, and 3B-SP, a micro cavity depth differs for each of the first to third red subpixels 1R-SP, 2R-SP, and 3R-SP, for each of the first to third green subpixels 1G-SP, 2G-SP, and 3G-SP, and for each of the first to third blue subpixels 1B-SP, 2B-SP, and 3B-SP.

In this case, since light emitted forward is used for the first red, green, and blue subpixels 1R-SP, 1G-SP, and 1B-SP of the red, green, and blue subpixels 1R-SP, 1G-SP, 1B-SP, 2R-SP, 2G-SP, 2B-SP, 3R-SP, 3G-SP, and 3B-SP, the following equation 2 may be satisfied in order to realize the micro cavity effect.

$$nd=(2m-1)\lambda(m=1, 2, \ldots)$$ (Equation 2)

In this case, n is a refractive index of an EML of the organic light emitting layers 113a, 113b, and 113c, d is a distance between the EML and the second electrode 115, m is a constant, and λ is a desired center-wavelength.

Since light emitted sideward is used for the second and third red, green, and blue subpixels 2R-SP, 2G-SP, 2B-SP, 3R-SP, 3G-SP, and 3B-SP of the red, green, and blue subpixels 1R-SP, 1G-SP, 1B-SP, 2R-SP, 2G-SP, 2B-SP, 3R-SP, 3G-SP, and 3B-SP, the following equation 3 may be satisfied in order to realize the micro cavity effect.

$$nd=(2m-1)\lambda/\sin(40°)(m=1, 2, \ldots)$$ (Equation 3)

In this case, 40° indicates a beam angle (=viewing angle) of light emitted from each of the subpixels 1R-SP, 1G-SP, 1B-SP, 2R-SP, 2G-SP, 2B-SP, 3R-SP, 3G-SP, and 3B-SP (region E of FIG. 5A).

In other words, when the micro cavity depth of the red subpixels 1R-SP, 2R-SP, and 3R-SP is 2800 nm, the first red subpixel 1R-SP is designed to have a micro cavity depth of 2800 nm, and the second and third red subpixels 2R-SP and 3R-SP are designed to have a micro cavity depth of 3757 nm (=2800/sin(40°)).

In addition, when the micro cavity depth of the green subpixels 1G-SP, 2G-SP, and 3G-SP is 2300 nm, the first green subpixel 1G-SP is designed to have a micro cavity depth of 2300 nm, and the second and third green subpixels 2G-SP and 3G-SP are designed to have a micro cavity depth of 3086 nm. When the micro cavity depth of the blue subpixels 1B-SP, 2B-SP, and 3B-SP is 2000 nm, the first blue subpixel 1B-SP is designed to have a micro cavity depth of 2000 nm, and the second and third blue subpixels 2B-SP and 3B-SP are designed to have a micro cavity depth of 2684 nm.

As described above, in the OLED device according to an aspect of the present disclosure, due to the arrangement structure of the subpixels 1R-SP, 1G-SP, 1B-SP, 2R-SP, 2G-SP, 2B-SP, 3R-SP, 3G-SP, and 3B-SP and the color filters R-CF, G-CF, and B-CF, the gaps between the subpixels 1R-SP, 1G-SP, 1B-SP, 2R-SP, 2G-SP, 2B-SP, 3R-SP, 3G-SP, and 3B-SP, and the arrangement structure of the openings 1R-O, 1G-O, 1B-O, 2R-O, 2G-O, 2B-O, 3R-O, 3G-O, and 3B-O of the black matrix BM, the first-first view image V1-1, the first-second view image V1-2, and the first-third view image V1-3 of red light are displayed through the first to third red subpixels 1R-SP, 2R-SP, and 3R-SP, the second-first view image V2-1, the second-second view image V2-2, and the second-third view image V2-3 of green light are displayed through the first to third green subpixels 1G-SP, 2G-SP, and 3G-SP, and the third-first view image V3-1, the third-second view image V3-2, and the third-third view image V3-3 of blue light are displayed through the first to third blue subpixels 1B-SP, 2B-SP, and 3B-SP. Accordingly, multiple views can be realized.

Particularly, even when the OLED of the present disclosure realizes a multi-view display device, the first to third red subpixels 1R-SP, 2R-SP, and 3R-SP configured to display the first-first to first-third view images V1-1, V1-2, and V1-3 are defined by dividing the red subpixels 1R-SP, 2R-SP, and 3R-SP on which the first organic light emitting layer 113a is deposited, the first to third green subpixels 1G-SP, 2G-SP, and 3G-SP configured to display the second-first to second-third view images V2-1, V2-2, and V2-3 are defined by dividing the green subpixels 1G-SP, 2G-SP, and 3G-SP on which the second organic light emitting layer 113b is deposited, and the first to third blue subpixels 1B-SP, 2B-SP, and 3B-SP configured to display the third-first to third-third view images V3-1, V3-2, and V3-3 are defined by dividing the blue subpixels 1B-SP, 2B-SP, and 3B-SP on which the third organic light emitting layer 113c is deposited. Therefore, it is not required to respectively form the organic light emitting layers 113a, 113b, and 113c in all of the subpixels 1R-SP, 1G-SP, 1B-SP, 2R-SP, 2G-SP, 2B-SP, 3R-SP, 3G-SP, and 3B-SP for realizing the first-first to third-third view images V1-1, V1-2, V1-3, V2-1, V2-2, V2-3, V3-1, V3-2, and V3-3, and the process efficiency may be improved.

Even without using an FMM, the size of the OLED of the present disclosure can be increased, the lifetime thereof can be extended, and power consumption thereof can be reduced.

Particularly, when the FMM is used in a process of forming the first to third organic light emitting layers 113a, 113b, and 113c, more view images can be realized and thus more various multiple views can be realized.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A multi-view display device comprising:
   first to third red subpixels, first to third green subpixels and first to third blue subpixels disposed on an array substrate and constituting a single unit pixel;
   a red color filter corresponding to the first to third red subpixels, a green color filter corresponding to the first to third green subpixels, a blue color filter corresponding to the first to third blue subpixels, wherein the red, green and blue color filters are on a color filter encapsulation substrate facing the array substrate; and
   a black matrix disposed on the color filter encapsulation substrate, having first red, green, and blue openings respectively corresponding to the first red, green, and blue subpixels, and overlapping the second and third red, green, and blue subpixels,
   wherein the first to third red subpixels respectively display a first-first view image, a first-second view image, and a first-third view image, the first to third green subpixels respectively display a second-first view image, a second-second view image, and a second-third view image, and the first to third blue subpixels respectively display a third-first view image, a third-second view image, and a third-third view image, and
   wherein the first-first view image, the second-first view image, and the third-first view image realize a first view image, the first-second view image, the second-second view image, and the third-second view image realize a second view image, and the first-third view image, the second-third view image, and the third-third view image realize a third view image.

2. The multi-view display device of claim 1, further comprising a first electrode disposed at each of the first to third red, green, and blue subpixels.

3. The multi-view display device of claim 2, further comprising a bank separating the first electrode disposed at each of the first to third red, green, and blue subpixels.

4. The multi-view display device of claim 2, further comprising a first organic light emitting layer disposed on the first electrode of the first to third red subpixels, a second organic light emitting layer disposed on the first electrode of the first to third green subpixels, and a third organic light emitting layer disposed on the first electrode of the first to third blue subpixels.

5. The multi-view display device of claim 3, further comprising second red, green, and blue openings respectively corresponding to the second red, green, and blue subpixels disposed over the bank and at a left side of the second red, green, and blue subpixels.

6. The multi-view display device of claim 3, further comprising third red, green, and blue openings respectively corresponding to the third red, green, and blue subpixels disposed over the bank and at a right side of the third red, green, and blue subpixels.

7. The multi-view display device of claim 4, further comprising a second electrode of a semi-transmissive conductive material disposed on each of the first to third organic light emitting layers.

8. The multi-view display device of claim 4, wherein the first red, green, and blue subpixels each satisfy $nd=(2m-1)\lambda$ ($m=1, 2, \ldots$), where n is a refractive index of an emitting material layer of each of the first to third organic light emitting layers, d is a distance between the emitting material layer and the second electrode, m is a constant, and $\lambda$ is a desired center-wavelength.

9. The multi-view display device of claim 4, wherein the second and third red, green, and blue subpixels each satisfy $nd=(2m-1)\lambda/\sin(40°)$ ($m=1, 2, \ldots$), where n is a refractive index of an emitting material layer of each of the first to third organic light emitting layers, d is a distance between the emitting material layer and the second electrode, m is a constant, and $\lambda$ is a desired center-wavelength.

10. The multi-view display device of claim 1, wherein a width of each of the first red, green, and blue openings satisfies (cell gap+thickness of black matrix)*tan(20°)*2, and a width of each of the second and third red, green, and blue openings satisfies (cell gap+thickness of black matrix)*tan(60°).

11. The multi-view display device of claim 1, further comprising a driving thin film transistor disposed in each of the first to third red, green, and blue subpixels on the array substrate, and
   wherein the driving thin film transistor includes a semiconductor layer, a gate insulating layer on the semiconductor layer, a gate electrode on the gate insulating layer, an interlayer insulating layer on the gate electrode, and source and drain electrodes on the interlayer insulating layer.

12. A multi-view display device including first to third red subpixels, first to third green subpixels and first to third blue subpixels disposed on an array substrate and constituting a single unit pixel, and the first to third red subpixels respectively display a first-first view image, a first-second view image, and a first-third view image, the first to third green subpixels respectively display a second-first view image, a second-second view image, and a second-third view image, and the first to third blue subpixels respectively display a third-first view image, a third-second view image, and a third-third view image, comprising;
   a black matrix disposed on the color filter encapsulation substrate, having first red, green, and blue openings respectively corresponding to the first red, green, and blue subpixels;
   a first electrode disposed at each of the first to third red, green, and blue subpixels;
   a bank separating the first electrode disposed at each of the first to third red, green, and blue subpixels;
   first, second and third organic light emitting layer respectively disposed on the first electrode of the first to third red subpixels, the first to third green subpixels and the first to third blue subpixels; and
   a second electrode of a semi-transmissive conductive material disposed on each of the first to third organic light emitting layers.

13. The multi-view display device of claim 12, wherein the first-first view image, the second-first view image, and the third-first view image realize a first view image, the first-second view image, the second-second view image, and the third-second view image realize a second view image, and the first-third view image, the second-third view image, and the third-third view image realize a third view image.

14. The multi-view display device of claim 12, further comprising a red color filter corresponding to the first to third red subpixels, a green color filter corresponding to the first to third green subpixels, a blue color filter corresponding to the first to third blue subpixels, wherein the red, green and blue color filters are disposed on a color filter encapsulation substrate facing the array substrate.

15. The multi-view display device of claim 12, further comprising second red, green, and blue openings respectively corresponding to the second red, green, and blue subpixels disposed over the bank and at a left side of the second red, green, and blue subpixels.

16. The multi-view display device of claim 12, further comprising third red, green, and blue openings respectively corresponding to the third red, green, and blue subpixels disposed over the bank and at a right side of the third red, green, and blue subpixels.

17. The multi-view display device of claim 12, wherein the first red, green, and blue subpixels each satisfy nd=(2m−1)λ(m=1, 2, ... ), where n is a refractive index of an emitting material layer of each of the first to third organic light emitting layers, d is a distance between the emitting material layer and the second electrode, m is a constant, and λ is a desired center-wavelength.

18. The multi-view display device of claim 12, wherein the second and third red, green, and blue subpixels each satisfy nd=(2m−1)λ/sin(40°) (m=1, 2, ... ), where n is a refractive index of an emitting material layer of each of the first to third organic light emitting layers, d is a distance between the emitting material layer and the second electrode, m is a constant, and λ is a desired center-wavelength.

19. The multi-view display device of claim 12, wherein a width of each of the first red, green, and blue openings satisfies (cell gap+thickness of black matrix)*tan(20°)*2, and a width of each of the second and third red, green, and blue openings satisfies (cell gap+thickness of black matrix)*tan(60°).

20. The multi-view display device of claim 12, further comprising a driving thin film transistor disposed in each of the first to third red, green, and blue subpixels on the array substrate, and wherein the driving thin film transistor includes a semiconductor layer, a gate insulating layer on the semiconductor layer, a gate electrode on the gate insulating layer, an interlayer insulating layer on the gate electrode, and source and drain electrodes on the interlayer insulating layer.

* * * * *